(12) United States Patent
Zheng et al.

(10) Patent No.: US 11,871,548 B2
(45) Date of Patent: Jan. 9, 2024

(54) CABINET AIR DUCT, CABINET ASSEMBLY AND PHOTOVOLTAIC INVERTER

(71) Applicant: Sungrow Power Supply Co., Ltd., Hefei (CN)

(72) Inventors: Hao Zheng, Hefei (CN); Qiyao Zhu, Hefei (CN); Xiaohu Wang, Anhui (CN); Jun Tan, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 0 days.

(21) Appl. No.: 17/672,598

(22) Filed: Feb. 15, 2022

(65) Prior Publication Data

US 2022/0271710 A1    Aug. 25, 2022

(30) Foreign Application Priority Data

Feb. 19, 2021   (CN) .................. 202110189482.X

(51) Int. Cl.
*H05K 7/20*    (2006.01)
*H02S 40/32*   (2014.01)
*H02S 40/42*   (2014.01)

(52) U.S. Cl.
CPC ..... *H05K 7/20909* (2013.01); *H05K 7/20918* (2013.01); *H02S 40/32* (2014.12); *H02S 40/425* (2014.12)

(58) Field of Classification Search
CPC ................ H05K 7/20909; H05K 7/20918
See application file for complete search history.

(56) References Cited

U.S. PATENT DOCUMENTS

| 2014/0098493 | A1  | 4/2014  | Chen et al. |
| 2015/0285255 | A1  | 10/2015 | Tsujimoto et al. |
| 2016/0302330 | A1* | 10/2016 | Hamari .............. H05K 7/209 |
| 2016/0360642 | A1* | 12/2016 | Talka ............... H05K 7/20918 |

FOREIGN PATENT DOCUMENTS

| CN | 201115064 Y | 9/2008 |
| CN | 201571292 U | 9/2010 |
| CN | 101959394 A | 1/2011 |
| CN | 203119741 U | 8/2013 |
| CN | 203597002 U | 5/2014 |
| CN | 103945673 A | 7/2014 |

(Continued)

OTHER PUBLICATIONS

First Office Action for Chinese Application No. 202110189482.X, dated Apr. 6, 2022.

(Continued)

*Primary Examiner* — Mukundbhai G Patel
(74) *Attorney, Agent, or Firm* — Wolf, Greenfield & Sacks, P.C.

(57) ABSTRACT

A cabinet air duct, a cabinet assembly and a photovoltaic inverter are provided according to the present application, where the cabinet air duct includes a cabinet and an air duct arranged in the cabinet. The cabinet is provided with an air inlet and an air outlet that are in communication with the air duct. The air inlet is arranged on a first side surface of the cabinet, the air outlet is arranged on a second side surface of the cabinet, and the first side surface and the second side surface are two opposite side surfaces of the cabinet.

15 Claims, 10 Drawing Sheets

(56) References Cited

FOREIGN PATENT DOCUMENTS

| | | |
|---|---|---|
| CN | 104158099 A | 11/2014 |
| CN | 205039712 U | 2/2016 |
| CN | 3 079 451 A1 | 10/2016 |
| CN | 205724520 U | 11/2016 |
| CN | 106301006 A | 1/2017 |
| CN | 206100681 U | 4/2017 |
| CN | 107396581 A | 11/2017 |
| CN | 206658360 U | 11/2017 |
| CN | 107659164 A | 2/2018 |
| CN | 107947604 A | 4/2018 |
| CN | 207352534 U | 5/2018 |
| CN | 207443335 U | 6/2018 |
| CN | 108495522 A | 9/2018 |
| CN | 208353786 U | 1/2019 |
| CN | 208569542 U | 3/2019 |
| CN | 110430714 A | 11/2019 |
| CN | 210167700 U | 3/2020 |
| CN | 210226028 U | 3/2020 |
| CN | 210519361 U | 5/2020 |
| CN | 210866928 U | 6/2020 |
| CN | 211860869 U | 11/2020 |
| CN | 212324615 U | 1/2021 |

OTHER PUBLICATIONS

Extended European Search Report for European Application No. 22157515.2, dated Jul. 19, 2022.
Second Office Action for Chinese Application No. 202110189482.X, dated Nov. 10, 2022.
Examination Report for Indian Patent Application No. 202244007984, dated Sep. 6, 2022.
Third Office Action for Chinese Application No. 202110189482.X, dated Apr. 22, 2023.

\* cited by examiner

CABINET AIR DUCT, CABINET ASSEMBLY AND PHOTOVOLTAIC INVERTER

CROSS-REFERENCE TO RELATED APPLICATIONS

This application claims priority to Chinese application number 202110189482.X, filed Feb. 19, 2021. The contents of these applications are incorporated herein by reference in their entirety.

FIELD

The present application relates to the field of heat dissipation by air ducts, and in particular to a cabinet air duct. The present application further relates to a cabinet assembly including the above cabinet air duct, and yet relates to a photovoltaic inverter including the above cabinet assembly.

BACKGROUND

In order to ensure normal operation of a heating device in a cabinet, a ventilation port is generally arranged inside the cabinet for communication with a colder atmosphere outside. For example, in a large-scale photovoltaic power plant, a photovoltaic inverter is an interface between a solar power system and a power grid, and with the upcoming realization of a large-scale photovoltaic power plant getting the power on the grid at a fair price, the demand for higher power of the photovoltaic grid-connected inverter becomes stronger, and therefore, the desire for the heat dissipation of the cabinet installed therein with electrical components becomes more prominent.

An air inlet of the conventional cabinet air duct is generally arranged at the bottom of a side wall of the cabinet, and an air outlet is arranged at the top of the same side wall as the air inlet of the cabinet. A fan is provided inside the air duct of the cabinet to realize flowing of the air.

Since the air inlet and the air outlet are located on the same side wall of the cabinet, the air duct is likely to be short-circuited during use, thereby reducing the heat dissipation effect of the air duct of the cabinet.

Therefore, a technical issue to be addressed by those skilled in the art is to improve the heat dissipation effect of the cabinet air duct.

SUMMARY

An object of the present application is to provide a cabinet air duct with improved heat dissipation effect. Another object of the present application is to provide a cabinet assembly including the above cabinet air duct. Another object of the present application is to provide a photovoltaic inverter including the above cabinet assembly.

In order to achieve the above objects, a cabinet air duct is provided according to the present application, which includes a cabinet and an air duct arranged in the cabinet, where the cabinet is provided with an air inlet and an air outlet that are in communication with the air duct; the air inlet is arranged on a first side surface of the cabinet, the air outlet is arranged on a second side surface of the cabinet, and the first side surface and the second side surface are two opposite side surfaces of the cabinet.

Preferably, a first cavity and a second cavity sealingly isolated from the first cavity are provided in the cabinet, and the air duct is located in the first cavity.

Preferably, the first cavity and the second cavity are isolated by a heat conducting plate.

Preferably, at least two first cavities are provided, and the first cavities are in one-to-one correspondence with the air ducts.

Preferably, the cabinet air duct further includes an air inlet guiding structure connected to a side wall of the cabinet and arranged at the air inlet.

Preferably, the cabinet air duct further includes an air outlet guiding structure connected to the side wall of the cabinet and arranged at the air outlet.

Preferably, the cabinet air duct further includes a fan, wherein the fan is arranged upstream and/or downstream from a heating device along an airflow direction.

Preferably, the fan includes a first fan arranged upstream from the heating device, and the first fan is located in the air inlet guiding structure and/or located upstream from the heating device in the cabinet along the airflow direction.

Preferably, the fan includes a second fan located downstream from the heating device, and the second fan is located in the air outlet guiding structure and/or downstream from the heating device in the cabinet along the airflow direction.

Preferably, a joint of the air inlet guiding structure and the cabinet and a joint of the air outlet guiding structure and the cabinet are respectively provided with a sealing member for sealing a gap therebetween.

Preferably, the cabinet air duct further includes a ventilation protective cover for preventing impurities from entering the air duct.

Preferably, the air inlet and the air outlet are arranged at the same height.

A cabinet assembly includes the cabinet air duct provided according to any one of the above and a cabinet door installed on the cabinet.

A cabinet assembly includes the cabinet air duct provided according to any one of the above and a cabinet door installed on the cabinet, where the air inlet and the air outlet are both provided on the cabinet door.

Preferably, the cabinet assembly further includes the air inlet guiding structure connected to a side wall of the cabinet and arranged the air inlet, and the air outlet guiding structure connected to the cabinet and arranged at the air outlet, wherein the air inlet guiding structure and the air outlet guiding structure are both arranged on an outer surface of the cabinet door.

Preferably, one of the air inlet guiding structure and the air outlet guiding structure is arranged on a rear door of the cabinet door, and the other is arranged on a front door of the cabinet door.

Preferably, the cabinet assembly further includes a fan, wherein the fan is arranged upstream and/or downstream from a heating device along an airflow direction, and the fan is installed on the front door and/or the rear door of the cabinet door.

A photovoltaic inverter includes the cabinet assembly described in any one of the above and a heating device installed inside the cabinet assembly.

In the above technical solutions, the cabinet air duct provided according to the present application includes a cabinet and an air duct arranged in the cabinet. The cabinet is provided with an air inlet and an air outlet that are in communication with the air duct. The air inlet is arranged on a first side surface of the cabinet, the air outlet is arranged on a second side surface of the cabinet, and the first side surface and the second side surface are two opposite side surfaces of the cabinet.

It can be seen from the above descriptions that, in the cabinet air duct provided according to the present application, since the air inlet is located on the first side surface of the cabinet, and the air outlet is located on the second side surface of the cabinet, that is, the air inlet and the air outlet are arranged on opposite side surfaces of the cabinet, the occurrence of a situation that the discharged hot air interferes with the entry of cold air is reduced. Therefore, the heat dissipation effect of the cabinet air duct provided according to the present application is improved.

BRIEF DESCRIPTION OF THE DRAWINGS

For more clearly illustrating embodiments of the present application or technical solutions in the conventional technology, the drawings referred to for describing the embodiments or the conventional technology will be briefly described hereinafter. Apparently, the drawings in the following description are only some examples of the present application, and for those skilled in the art, other drawings may be obtained based on the provided drawings without any creative efforts.

Figure 1:
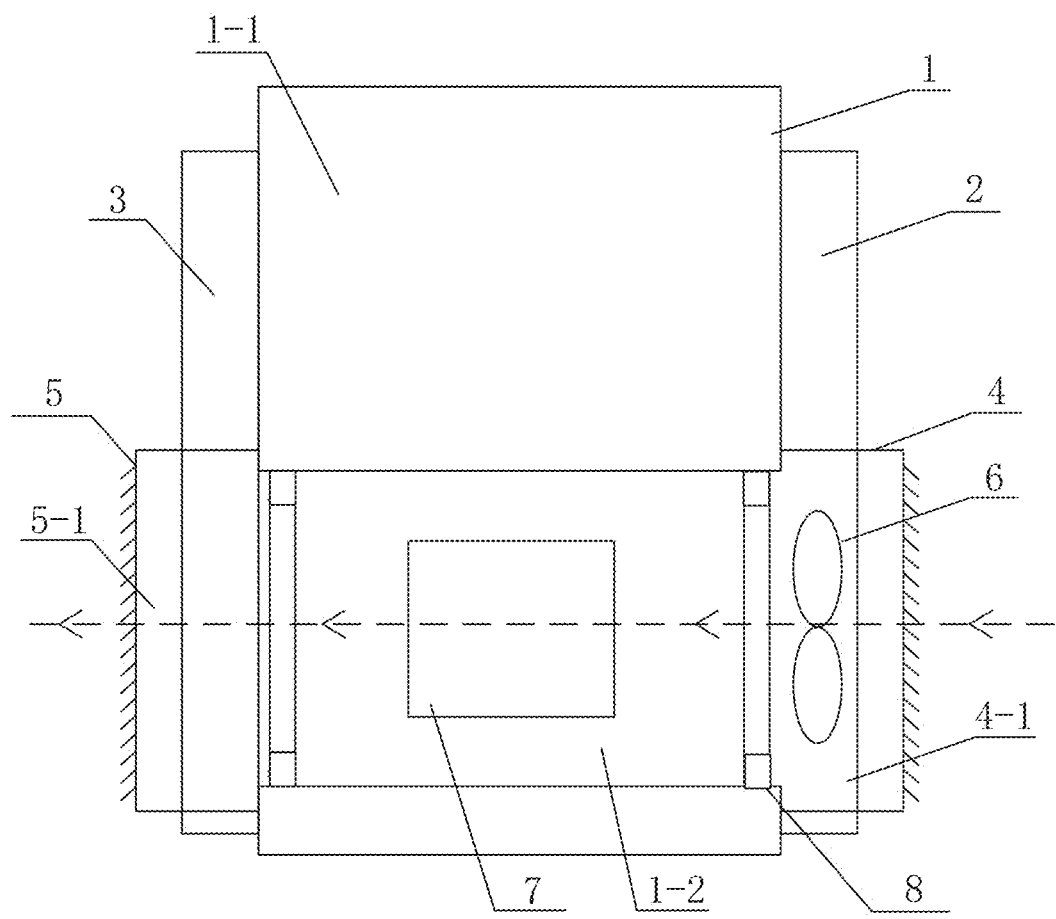
FIG. 1 is a structural layout view of a first type of cabinet air duct provided according to an embodiment of the present application.
Figure 2:
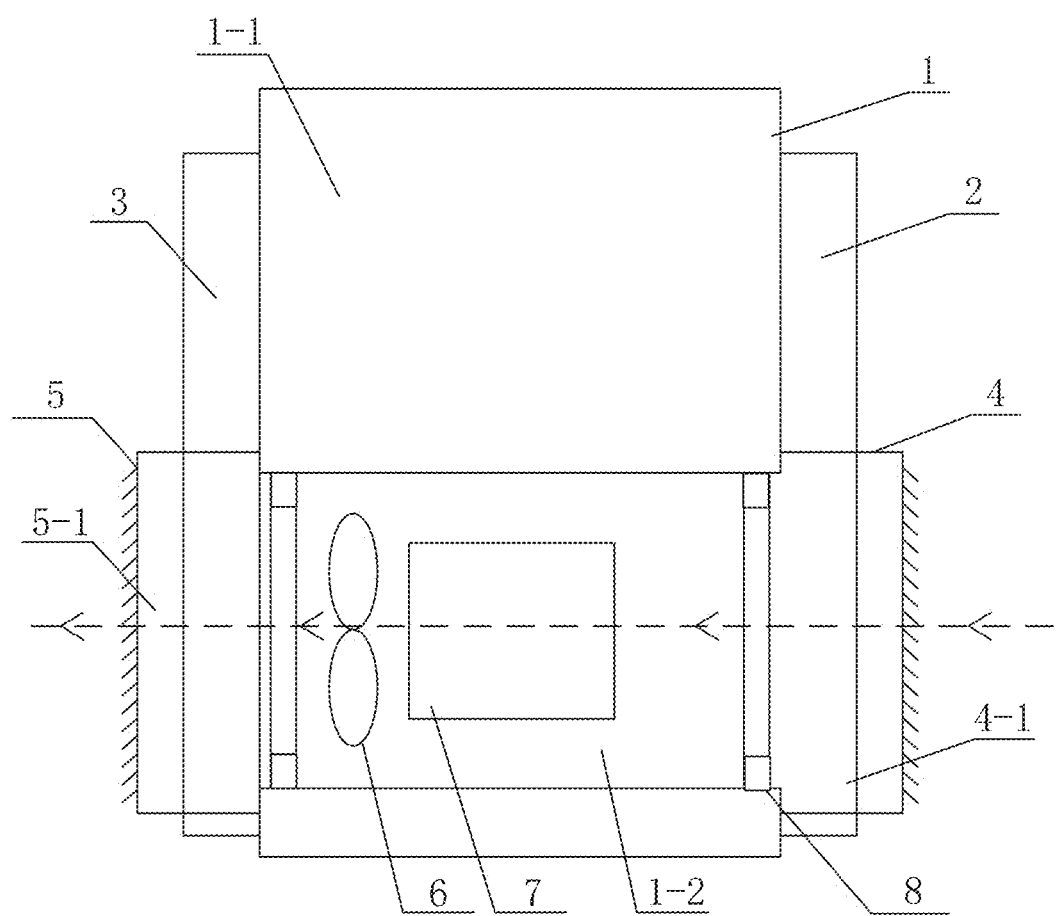
FIG. 2 is a structural layout view of a second type of cabinet air duct provided according to an embodiment of the present application.
Figure 3:
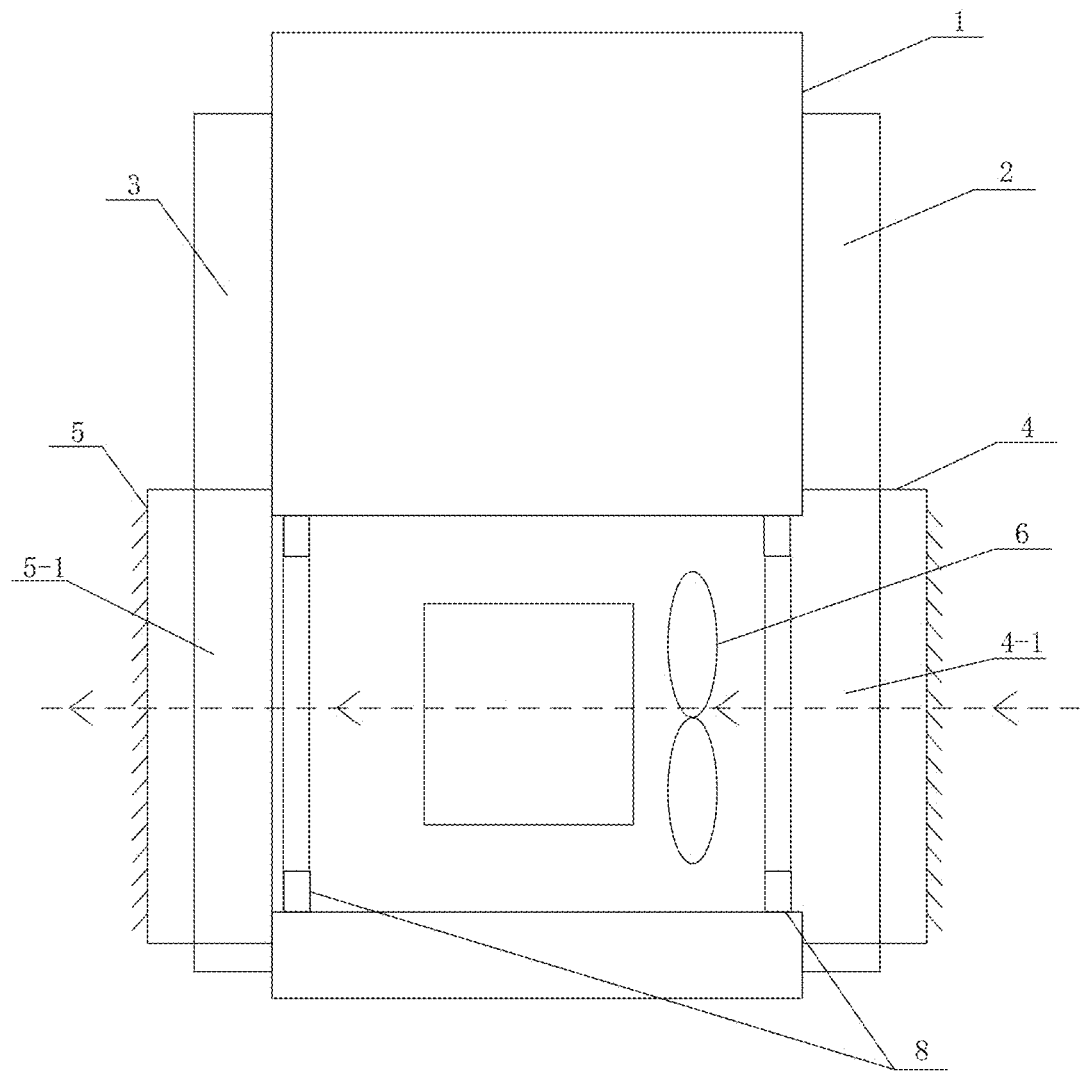
FIG. 3 is a structural layout view of a third type of cabinet air duct provided according to an embodiment of the present application.
Figure 4:
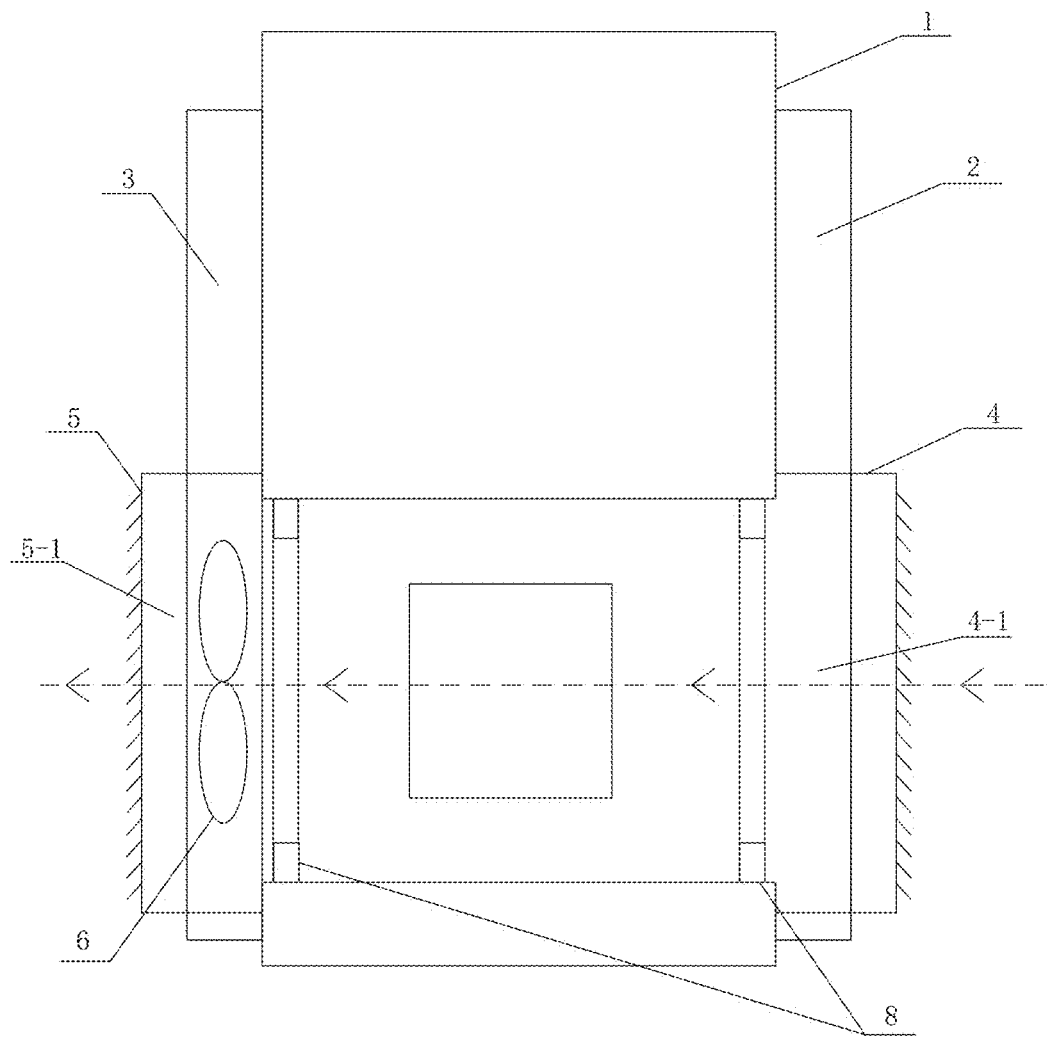
FIG. 4 is a structural layout view of a fourth type of cabinet air duct provided according to an embodiment of the present application.
Figure 5:
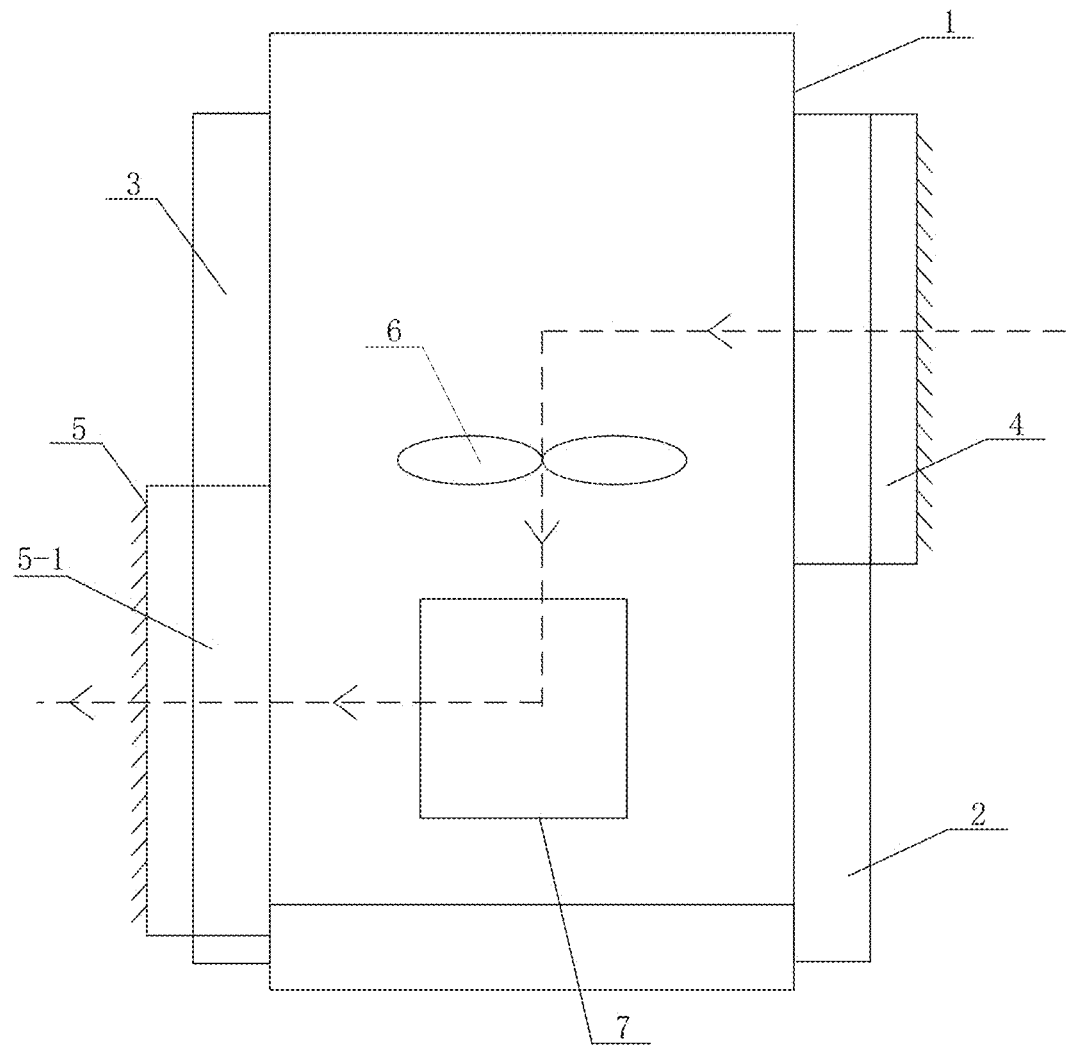
FIG. 5 is a structural layout view of a fifth type of cabinet air duct provided according to an embodiment of the present application.
Figure 6:
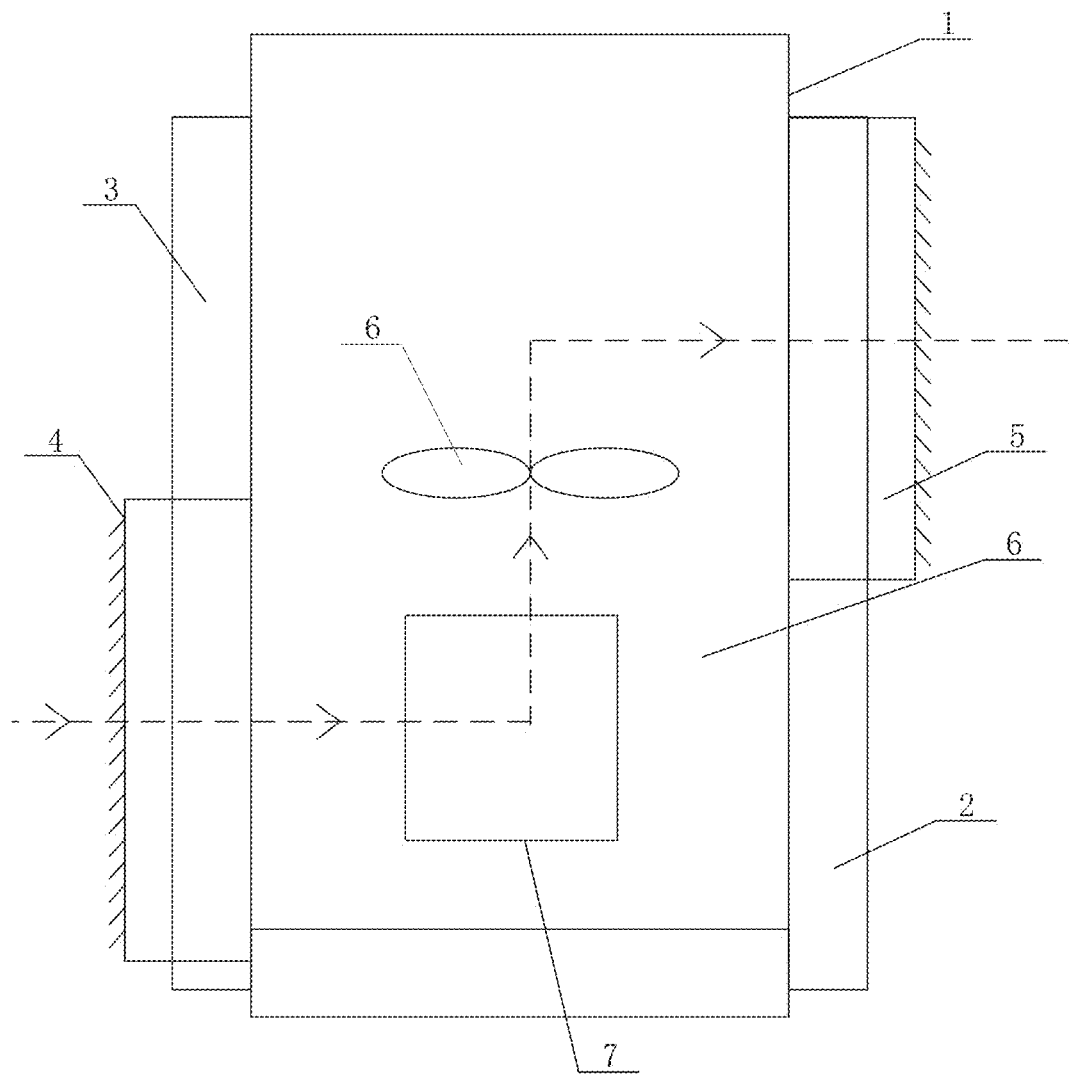
FIG. 6 is a structural layout view of a sixth type of cabinet air duct provided according to an embodiment of the present application.
Figure 7:
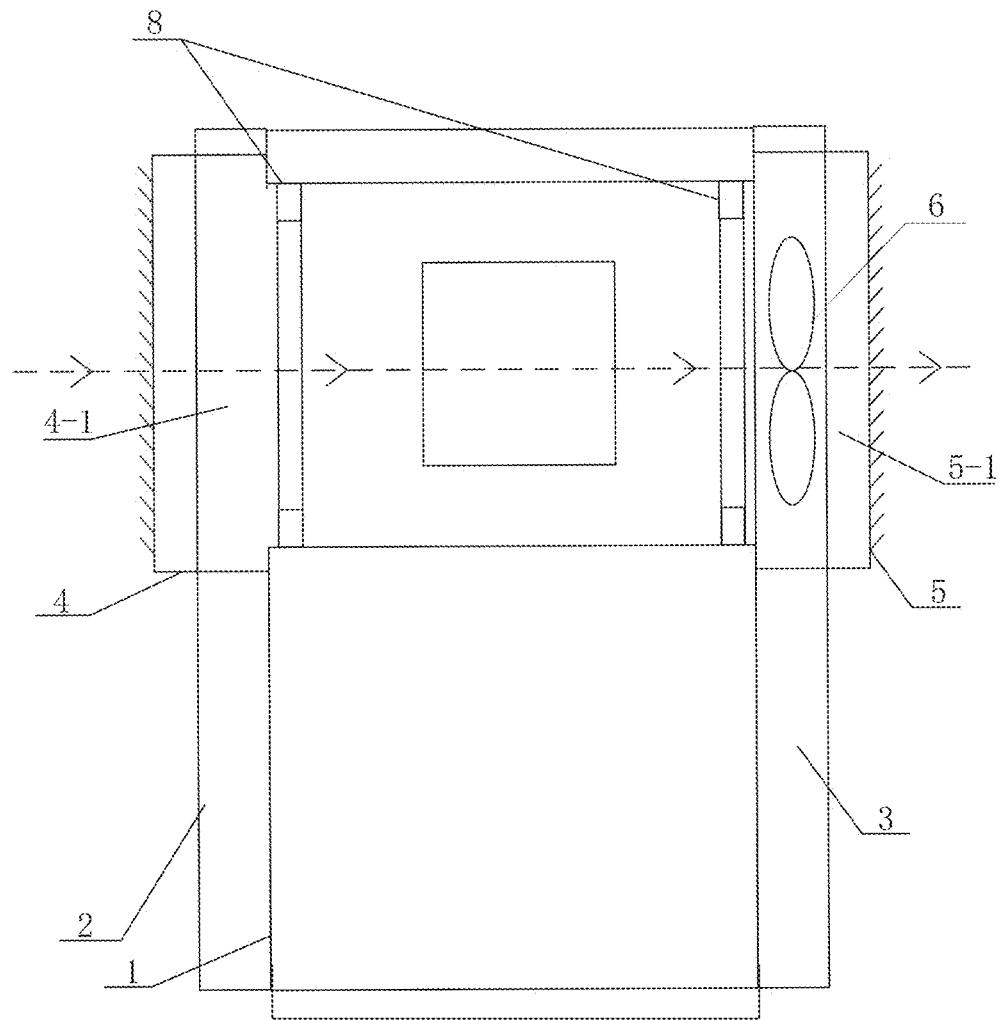
FIG. 7 is a structural layout view of a seventh type of cabinet air duct provided according to an embodiment of the present application.
Figure 8:
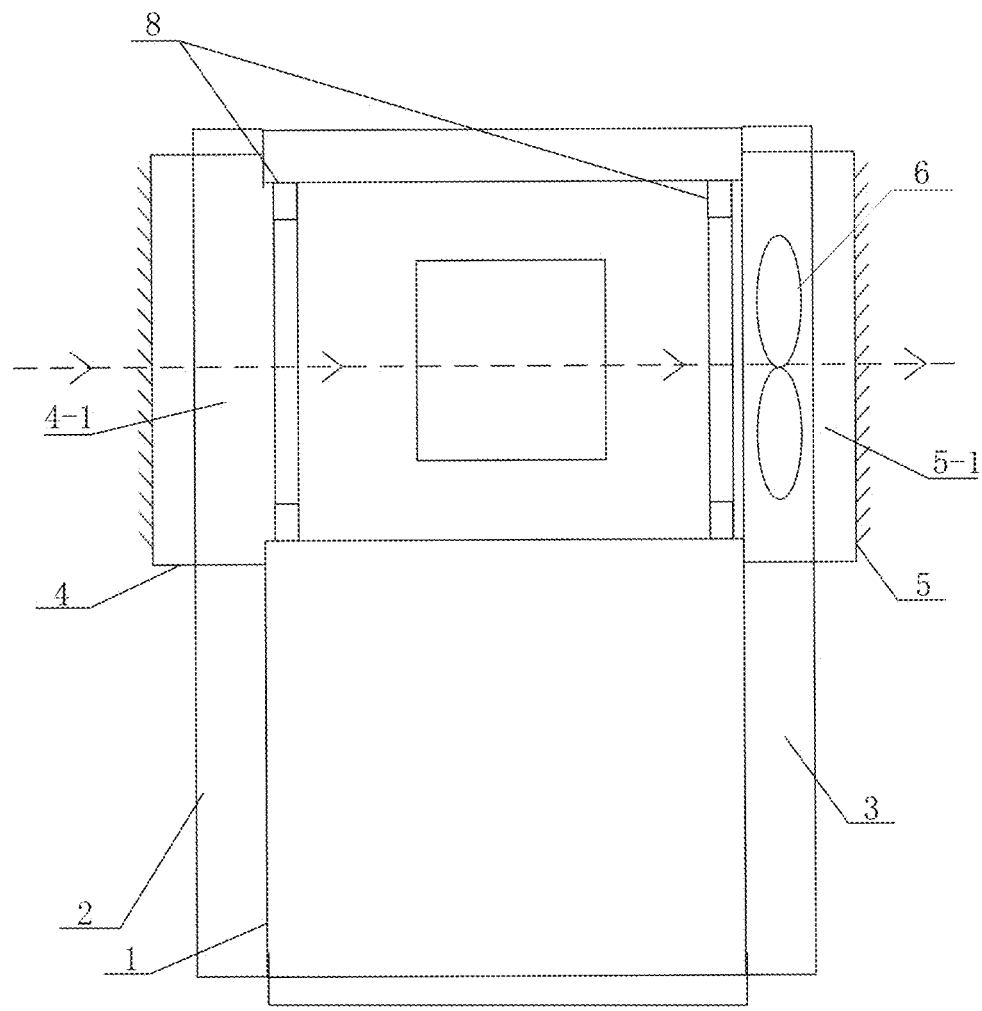
FIG. 8 is a structural layout view of an eighth type of cabinet air duct provided according to an embodiment of the present application.
Figure 9:
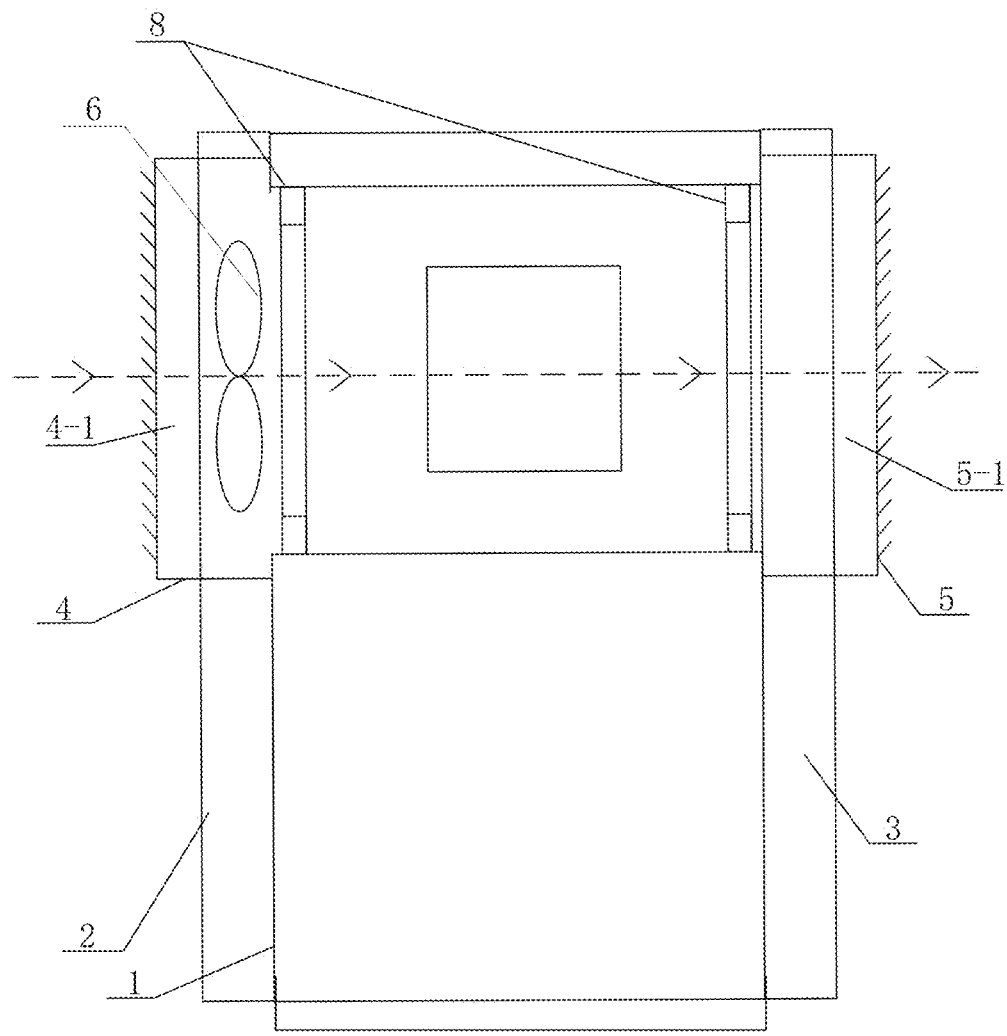
FIG. 9 is a structural layout view of a ninth type of cabinet air duct provided according to an embodiment of the present application.
Figure 10:
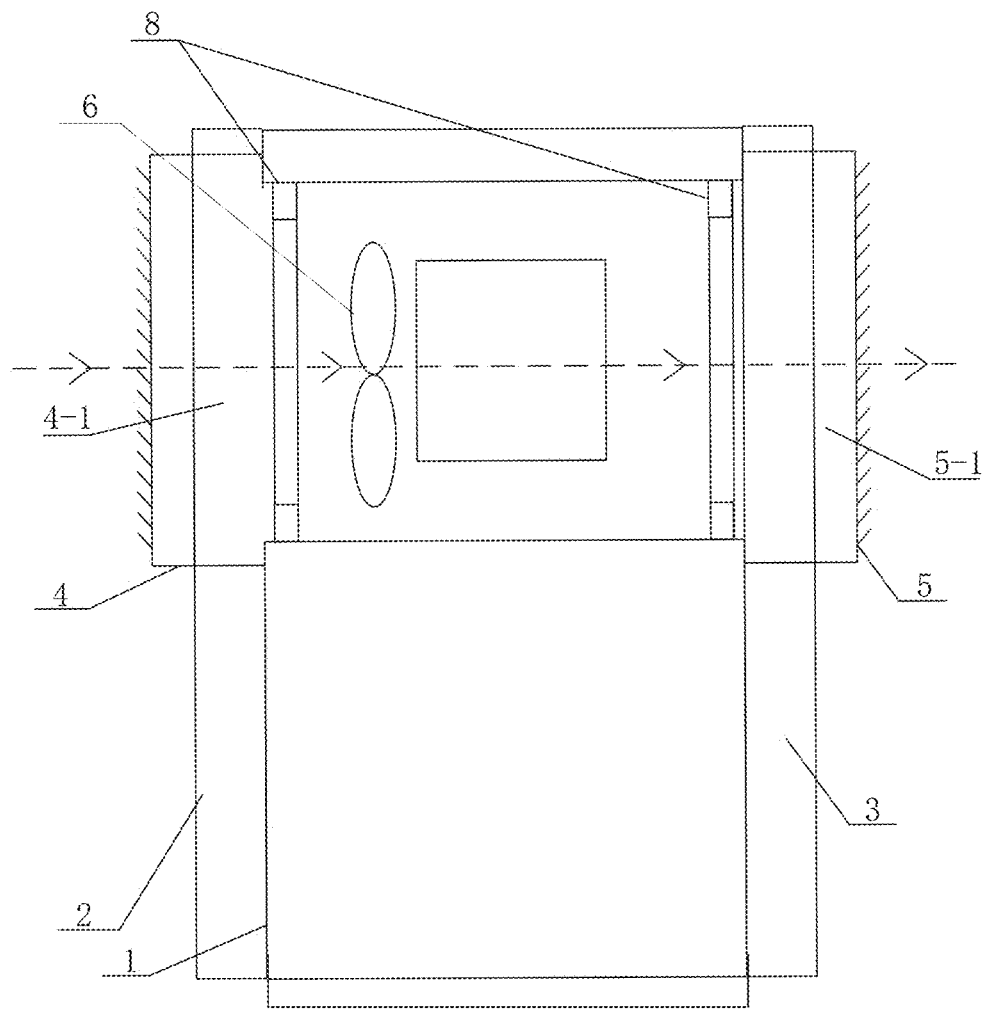
FIG. 10 is a structural layout view of a tenth type of cabinet air duct provided according to an embodiment of the present application.

Reference numerals in FIGS. 1 to 10 are listed as follows:

| 1 cabinet; | 1-1 second cavity; |
|---|---|
| 1-2 first cavity; | 2 front door; |
| 3 rear door; | 4 air inlet guiding structure; |
| 4-1 air inlet cavity; | 5 air outlet guiding structure; |
| 5-1 air outlet cavity; | 6 fan; |
| 7 heating device; | 8 sealing member. |

DETAILED DESCRIPTION OF THE EMBODIMENTS

A core of the present application is to provide a cabinet air duct with improved heat dissipation effect. Another core of the present application is to provide a cabinet assembly including the above cabinet air duct. Another core of the present application is to provide a photovoltaic inverter including the above cabinet assembly.

In order to enable those skilled in the art to better understand the technical solutions of the present application, the present application will be further described in detail below with reference to the accompanying drawings and embodiments.

Reference is made to FIGS. 1 to 10.

In an embodiment, a cabinet air duct provided according to an embodiment of the present application includes a cabinet 1 and an air duct arranged in the cabinet 1. The cabinet 1 is provided with an air inlet and an air outlet that are in communication with the air duct. The air inlet is arranged on a first side surface of the cabinet 1, and the air outlet is arranged on a second side surface of the cabinet 1. The first side surface and the second side surface are two opposite side surfaces of the cabinet 1, that is, the air inlet and the air outlet are respectively arranged on two sides of the cabinet 1.

In order to facilitate flow of the air, preferably, the air duct is arranged horizontally, and the air inlet and the air outlet are symmetrically distributed on two side surfaces of the cabinet 1 about a center line of the cabinet 1.

It can be seen from the above descriptions that, in the cabinet air duct provided according to a specific embodiment of the present application, since the air inlet is located on the first side surface of the cabinet 1, and the air outlet is located on the second side surface of the cabinet 1, that is, the air inlet and the air outlet are arranged on different side surfaces of the cabinet 1 to reduce the occurrence of short circuit of air at the air inlet and air outlet, thereby reducing the occurrence of a situation that the discharged hot air interferes with the entry of cold air. Therefore, the heat dissipation effect of the cabinet air duct provided according to the present application is improved.

Specifically, heating devices 7 in the cabinet 1 may all be located in the air duct. Taking into account the sealing of part of the heating devices 7, preferably, a first cavity 1-2 and a second cavity 1-1 sealingly isolated from the first cavity 1-2 are provided in the cabinet 1, and the air duct is arranged in the first cavity 1-2.

In order to facilitate the heat dissipation of the devices in the second cavity 1-1, preferably, the first cavity 1-2 and the second cavity 1-1 are isolated by a heat conducting plate. Specifically, edges of the heat conducting plate are sealed with an inner wall of the cabinet 1 by bonding.

The shape, thickness, and material of the heat conducting plate are determined according to actual requirements, which are not specifically limited in the present application.

In a specific embodiment, at least two first cavities 1-2 are provided, and the at least two first cavities 1-2 are in one-to-one correspondence with the air ducts. That is, each of the at least two first cavities 1-2 is preferably arranged independently. The at least two first cavities 1-2 may be arranged horizontally, or the at least two first cavities 1-2 are arranged sequentially from top to bottom.

In a specific embodiment, the cabinet air duct further includes an air inlet guiding structure 4 connected to a side wall of the cabinet 1 and arranged at the air inlet, wherein an air inlet cavity 4-1 in communication with the air inlet is defined inside the air inlet guiding structure 4.

Further, the cabinet air duct further includes an air outlet guiding structure 5 connected to the cabinet 1 and arranged at the air outlet, wherein an air outlet cavity 5-1 in communication with the air outlet is defined inside the air outlet guiding structure 5.

In order to further improve the heat dissipation effect, preferably, the cabinet air duct further includes a fan 6 arranged upstream or downstream from the heating device 7. The fan 6 may also be provided both upstream and downstream from the heating device 7. In a case that the fan 6 is arranged upstream from the heating device 7, the influence of hot air on the fan 6 is reduced.

In an embodiment, the fan 6 may be directly arranged inside the air duct.

As shown in FIGS. 1, 3, 5, 9 and 10, the fan 6 includes a first fan arranged upstream from the heating device 7, and the first fan is located in the air inlet guiding structure 4 and/or located upstream from the heating device 7 in the cabinet 1. One or more first fans may be provided. In a case that multiple first fans are provided, preferably, the first fans are arranged perpendicular to an airflow direction.

As shown in FIGS. 2, 4, 6, 7 and 8, the fan 6 includes a second fan arranged downstream from the heating device 7, and the second fan is located in the air outlet guiding structure 5 and/or located downstream from the heating device 7 in the cabinet 1. One or more second fans may be provided. In a case that multiple second fans are provided, preferably, the second fans are arranged perpendicular to the airflow direction.

In order to improve the sealing, preferably, a joint of the air inlet guiding structure 4 and the cabinet 1 and a joint of the air outlet guiding structure 5 and the cabinet 1 are respectively provided with a sealing member 8 for sealing a gap therebetween. The sealing member 8 may be embodied as a sealant strip, or an elastic sealing member bonded to the cabinet 1. The sealing member 8 is configured to isolate the air inlet guiding structure 4 and the air outlet guiding structure 5 from the second cavity 1-1, so as to ensure that the airflow of the air duct will not flow into the second cavity 1-1 of the cabinet 1.

On the basis of the above solutions, preferably, the cabinet air duct further includes a ventilation protective cover for preventing impurities from entering the air duct. The ventilating protective cover may be embodies as a waterproof breathable membrane. With the arrangement of the ventilation protective cover, the cabinet 1 has a certain waterproof and dustproof function, which can ensure that the cabinet 1 has a certain degree of protection.

A cabinet assembly provided according to the present application includes any of the above cabinet air ducts and a cabinet door installed on the cabinet. The specific structure of the cabinet air duct is described above, and the cabinet assembly includes the above cabinet air duct, so the cabinet assembly also has the above technical effects.

In another cabinet assembly, in order to simplify the layout of the air ducts, the air inlet guiding structure 4 and the air outlet guiding structure 5 are both arranged on the cabinet door of the cabinet 1, and the air inlet guiding structure 4 and the air outlet guiding structure 5 are both arranged on the outer surface of the cabinet door. In an embodiment, the air inlet guiding structure 4 and the air outlet guiding structure 5 are fixedly connected to the cabinet door. Preferably, the air inlet guiding structure 4 and the air outlet guiding structure 5 are detachably connected to the cabinet door.

In an embodiment, one of the air inlet guiding structure 4 and the air outlet guiding structure 5 is arranged on a rear door 3 of the cabinet door, and the other is arranged on a front door 2 of the cabinet door. Preferably, the air inlet guiding structure 4 and the air outlet guiding structure 5 protrude from the outer surfaces of the front door 2 and the rear door 3.

The front door 2 and the rear door 3 may each be provided with a sealing plate structure to seal the door body.

In a specific embodiment, the fan 6 is installed on the front door 2 and/or the rear door 3 of the cabinet door. Specifically, one of the air inlet and the air outlet is provided on the front door 2 and the other is provided on the rear door 3. Besides, the fan 6 is also arranged on the cabinet door, which can facilitate the maintenance of the fan 6. Moreover, the air duct layout of the entire cabinet 1 is compact, the utilization rate is high, and the heat dissipation efficiency can be more effectively improved.

A photovoltaic inverter provided according to the present application includes the cabinet assembly according to any one of the above and a heating device 7 installed inside the cabinet assembly. The specific structure of the cabinet assembly is described above, and the photovoltaic inverter includes the above cabinet assembly, so the photovoltaic inverter also has the above technical effects.

The above embodiments are described in a progressive manner. Each of the embodiments is mainly focused on describing its differences from other embodiments, and reference may be made among these embodiments with respect to the same or similar parts.

Based on the above description of the disclosed embodiments, those skilled in the art can implement or deploy the present application. Various modifications to the embodiments are apparent to the person skilled in the art, and the general principle herein can be implemented in other embodiments without departing from the spirit or scope of the present application. Hence, the present application is not limited to the embodiments disclosed herein, but is to conform to the widest scope in accordance with the principle and novel features disclosed herein.

The invention claimed is:

1. A cabinet assembly, comprising a cabinet, a cabinet air duct arranged in the cabinet, a fan, and a cabinet door installed on the cabinet, wherein the cabinet is provided with an air inlet and an air outlet which are in communication with the cabinet air duct;
    wherein the cabinet door includes a front door and a rear door; the front door and the rear door are provided in a first side surface and a second side surface of the cabinet, respectively, and the first side surface and the second side surface are two opposite side surfaces of the cabinet,
    wherein a first cavity and a second cavity sealingly isolated from the first cavity are provided in the cabinet, the cabinet air duct is provided in the first cavity;
    wherein the fan is arranged upstream or downstream from a heating device arranged in the first cavity along an airflow direction.

2. The cabinet assembly according to claim 1, wherein the first cavity and the second cavity are isolated by a heat conducting plate.

3. The cabinet assembly according to claim 1, wherein the number of the first cavity is at least two, and the at least two first cavities are in one-to-one correspondence with the air ducts.

4. The cabinet assembly according to claim 1, further comprising an air inlet guiding structure connected to a side wall of the cabinet and arranged at the air inlet.

5. The cabinet assembly according to claim 4, further comprising an air outlet guiding structure connected to the cabinet and arranged at the air outlet.

6. The cabinet assembly according to claim 5, wherein a joint of the air inlet guiding structure and the cabinet and a joint of the air outlet guiding structure and the cabinet are respectively provided with a sealing member for sealing a gap therebetween.

7. The cabinet assembly according to claim 1, wherein the fan comprises a first fan arranged upstream from the heating device, and the first fan is located in the air inlet guiding structure and/or located upstream from the heating device in the cabinet along the airflow direction.

8. The cabinet assembly according to claim 1, wherein the fan comprises a second fan located downstream from the heating device, and the second fan is located in the air outlet guiding structure and/or downstream from the heating device in the cabinet along the airflow direction.

9. The cabinet assembly according to claim 1, further comprising a ventilation protective cover for preventing impurities from entering the air duct.

10. The cabinet assembly according to claim 1, wherein the air inlet and the air outlet are arranged at a same height.

11. The cabinet assembly according to claim 1, wherein the air inlet and the air outlet are both provided on the cabinet door.

12. The cabinet assembly according to claim 11, wherein the air inlet guiding structure and the air outlet guiding structure are both arranged on an outer surface of the cabinet door.

13. The cabinet assembly according to claim 12, wherein one of the air inlet guiding structure and the air outlet guiding structure is arranged on a rear door of the cabinet door, and the other is arranged on a front door of the cabinet door.

14. The cabinet assembly according to claim 11, the fan is installed on the front door and/or the rear door of the cabinet door.

15. A photovoltaic inverter, comprising the cabinet assembly according to claim 1 and a heating device installed inside the cabinet assembly.

* * * * *